(12) United States Patent
Trapp et al.

(10) Patent No.: US 10,827,639 B2
(45) Date of Patent: Nov. 3, 2020

(54) HOUSING FOR RECEIVING AT LEAST ONE ELECTROMECHANICAL, ELECTRICAL AND/OR ELECTRONIC COMPONENT

(71) Applicant: Weidmüller Interface GmbH & Co. KG, Detmold (DE)

(72) Inventors: Ulrich Trapp, Detmold (DE); Ralf Schumacher, Lemgo (DE); Mike Beermann, Detmold (DE); Niklas Wendt, Schlangen (DE)

(73) Assignee: Weidmüller Interface GmbH & Co. KG (DE)

( * ) Notice: Subject to any disclaimer, the term of this patent is extended or adjusted under 35 U.S.C. 154(b) by 0 days.

(21) Appl. No.: 16/685,139

(22) Filed: Nov. 15, 2019

(65) Prior Publication Data

US 2020/0170137 A1    May 28, 2020

(30) Foreign Application Priority Data

Nov. 26, 2018 (DE) .................... 20 2018 106 719 U

(51) Int. Cl.
*H05K 7/14* (2006.01)
*H05K 5/02* (2006.01)

(52) U.S. Cl.
CPC ......... *H05K 7/1427* (2013.01); *H05K 5/0221* (2013.01); *H05K 7/1417* (2013.01)

(58) Field of Classification Search
CPC ...... H05K 7/1427; H05K 7/1417; H05K 7/14; H05K 7/1428; H05K 5/0221; H05K 5/0217; H05K 5/0247
See application file for complete search history.

(56) References Cited

U.S. PATENT DOCUMENTS

| 5,266,052 A | * | 11/1993 | Phillips, II | ............ | F16B 13/126 |
| | | | | | 411/502 |
| 6,052,274 A | * | 4/2000 | Remsburg | ............. | F16B 19/109 |
| | | | | | 361/679.58 |
| 2010/0002389 A1 | * | 1/2010 | Tung | ................... | H05K 7/20172 |
| | | | | | 361/697 |
| 2014/0063759 A1 | | 3/2014 | Honda | | |
| 2016/0044800 A1 | * | 2/2016 | Jarvis | .................... | H01R 43/205 |
| | | | | | 361/759 |
| 2016/0169259 A1 | * | 6/2016 | Burleson | ............... | F16B 5/0642 |
| | | | | | 411/510 |

FOREIGN PATENT DOCUMENTS

| DE | 1145240 B | 3/1963 |
| DE | 19506664 A1 | 2/1996 |
| DE | 102005001146 A1 | 8/2005 |
| DE | 102004052202 A1 | 5/2006 |
| DE | 102010036272 A1 | 3/2012 |
| DE | 102013109433 A1 | 4/2014 |

* cited by examiner

*Primary Examiner* — Timothy J Thompson
*Assistant Examiner* — Amol H Patel
(74) *Attorney, Agent, or Firm* — Laubscher & Laubscher, P.C.

(57) ABSTRACT

A housing to hold at least one electromechanical, electrical and/or electronic component includes at least one fastening element arranged on a portion of the housing for the component. A recess is formed in the housing portion and the fastening element is arranged in the recess.

6 Claims, 4 Drawing Sheets

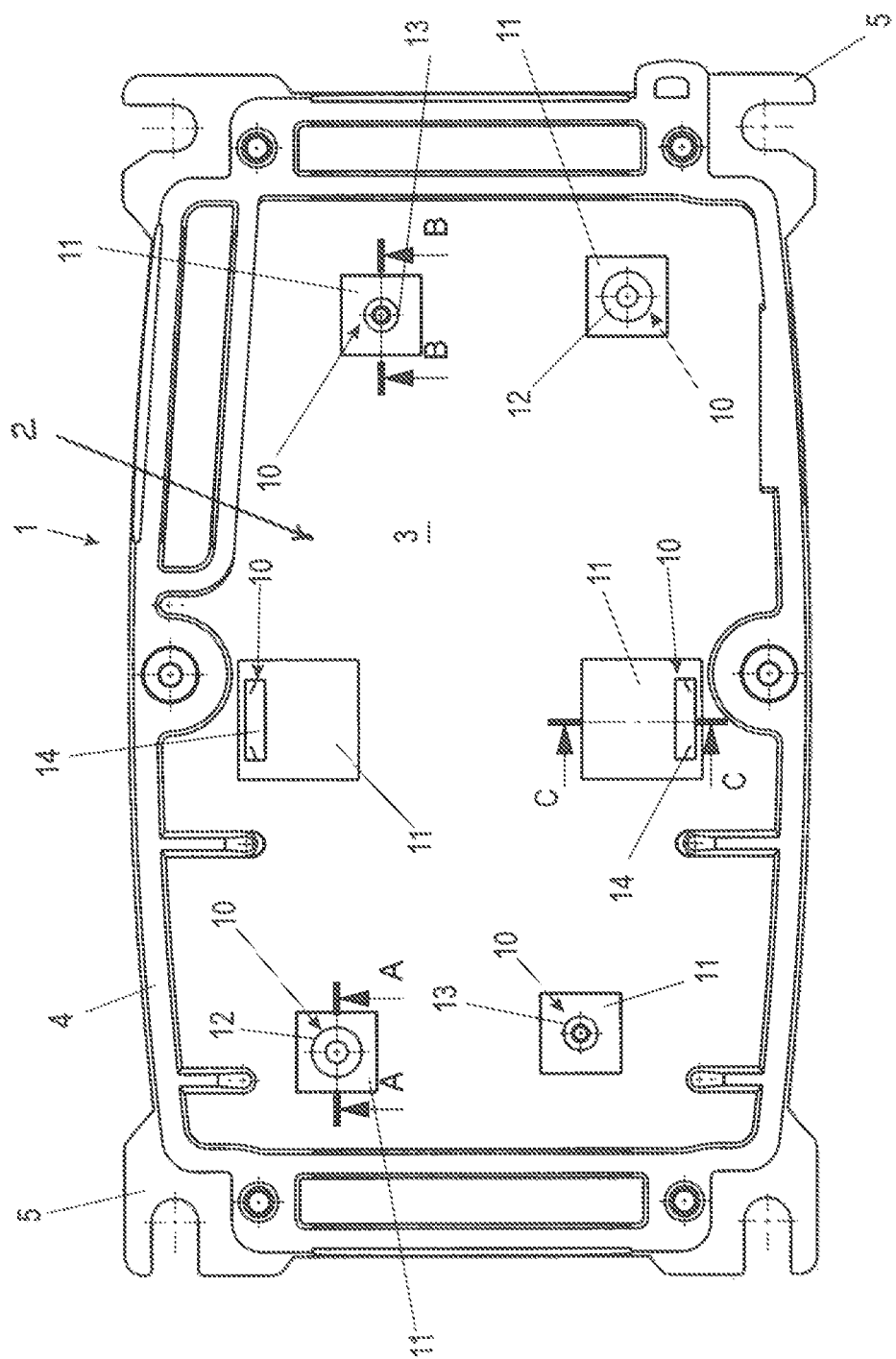

HOUSING FOR RECEIVING AT LEAST ONE ELECTROMECHANICAL, ELECTRICAL AND/OR ELECTRONIC COMPONENT

This application is a § 371 National Stage Entry of International Patent Application No. PCT/EP2018/061411 filed May 3, 2018. Application No. PCT/EP2018/061411 claims priority of DE 202017111523.4 filed May 26, 2017. The entire content of these applications is incorporated herein by reference.

BACKGROUND OF THE INVENTION

The invention relates to a housing to hold at least one electromechanical, electrical and/or electronic component, such as a circuit board or a rail section. The housing at least one fastening element arranged on a housing portion for the component.

Such housings may be relatively small with an interior volume of less than one liter or a few liters. They are often used in the industrial field to hold components, especially in a field distribution away from central switch cabinets.

Often the housings have a two-piece construction including a housing base portion and a closable cover. Generally, fastening elements are provided in the housing base portion and serve to fasten or retain the components contained therein, Such fastening elements may include round bases which serve as a spacer and as support points for the components, screw-in bosses for screw fastening of the components or latching elements such as latching tongues or hooks for latched fastening of the components.

Depending on the application, however, fastening elements may not be required or may be a disturbance if they take up space required by the components, Generally, the housing is made of plastic which allows the fastening elements to be broken off, for example by pliers. However, a problem may arise if the fastening elements do not break off smoothly and flush with a housing surface, but rather with fracture residues, such as fracture edges, which protrude from the housing surface to prevent mounting of components flush with the surface in this area.

The problem which the present invention proposes to solve is to create a housing of the aforementioned type in which fastening elements can be broken off without fracture residues remaining to prevent flush mounting of components.

SUMMARY OF THE INVENTION

A housing according to the invention includes a recess in the housing portion in which at least one fastening element is provided. The recess is formed around at least one fastening element. When the fastening element is broken off, a fracture or residual edge may protrude above a base surface, but not above the surface of the housing portion, so that components can be mounted flush on this surface.

In one embodiment of the housing, the fastening element is arranged on a bottom of a housing base portion. Such housings with a housing base portion which can generally be closed by a cover and in which the components contained therein are fastened to the housing base portion have diversified uses. But it is understood that the recess according to the invention can also be provided on other housing portions, e.g., the cover or in another place on the housing base portion such as on a side wall.

In another embodiment of the housing, the fastening element is formed integrally with the housing portion. It is thus possible to provide multiple fastening elements in an easy manner which can be removed as needed.

Suitable fastening elements include a base, especially a round base, a screw boss and a latching tongue.

In another embodiment of the housing, the recess surrounds the fastening element as a rectangle. Such a recess configuration accommodates tools such as flat pliers which are typically used to break off the fastening elements. The tool may be lowered down to the base surface of the recess in order to grasp the fastening element.

In alternative embodiments, other forms may be chosen for the recess such as an encircling trench.

The recess preferably has a depth of 0.3 to 0.8 mm with respect to a surface of the housing portion. This depth is adequate for typical fracture residues and at the same time it is small enough not to mechanically weaken the housing when the housing has a conventional wall thickness.

BRIEF DESCRIPTION OF THE FIGURES

Other objects and advantages of the invention will become apparent from a study of the following description when viewed in the light of the accompanying drawing, in which;

FIG. 1 is a top view of a housing base portion of an opened housing;

FIG. 3c is a sectional view of an alternative embodiment of the housing in the area of the second fastening element shown in FIG. 3a.

DETAILED DESCRIPTION

Figure 2A:
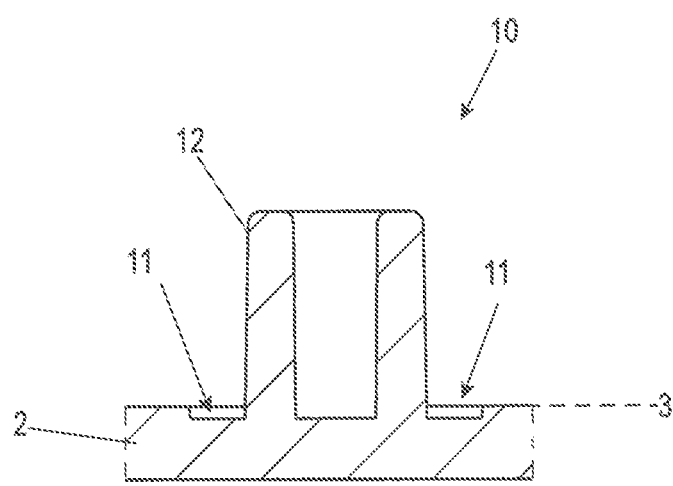
FIGS. 2a and 2b are sectional views through a first fastening element taken along line A-A of FIG. 1 before and after the fastening element has been broken off, respectively.

FIG. 1 shows a top view of a housing base portion 1 of one embodiment of a housing according to the invention. The housing serves to contain electromechanical, electrical and/or electronic components. After installation and connection of a component, the housing is closed by a housing cover, not shown.

The housing base portion 1 includes a housing bottom 2, having a substantially flat surface 3. At the sides, the housing base portion 1 is bounded by side walls which extend from the bottom 2 substantially perpendicularly, i.e., extending from the plane of the drawing in FIG. 1. Arranged on the outside of the housing are mounting elements 5 which enable fastening of the housing to a surface. The shape, size and proportion of the housing base portion 1 and the configuration of the mounting elements 5 are purely exemplary.

Various fastening elements 10 are arranged on the housing bottom 2. Preferably, these fastening elements 10 are integrally formed with the bottom 2 and thus with the housing base portion 1. For example, three different fastening elements are formed in the housing of FIG. 1, two of which are present each time. The fastening elements 10 include round bases 12, screw-in bosses 13 and latching tongues 14. The fastening elements 10 shown, for example, are designed to hold a circuit board. This is installed parallel to the bottom 2 in the housing base portion and lies against the round bases 12 and the screw-in bosses 13. When installed, the circuit board interlocks with the latching tongues 14 and can be fastened with a screw which is screwed into the respective screw-in bosses 13.

The fastening elements 10 do not stand directly on or in the same plane as the bottom surface 3, but rather are arranged in recesses 11 which surround the fastening elements 10, respectively. If one or more of the fastening elements 10 are not needed for a particular component installed in the housing base portion 1, they can be grasped with pliers, for example, and broken off by bending them. The recesses 11 ensure that any remaining fracture edges do not extend beyond the bottom surface 3 so that the fracture edges are not a disturbance when components are to be mounted on and flush with the bottom surface.

Figure 3A:
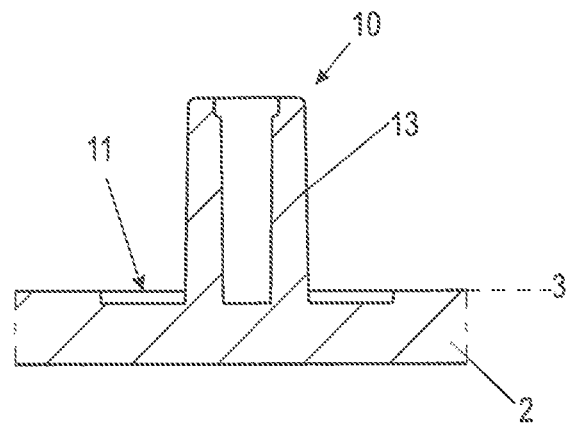
FIGS. 3a and 3b are sectional views through a second fastening element taken along line B-B of FIG. 1 before and after the fastening element has been broken off, respectively.
Figure 4A:
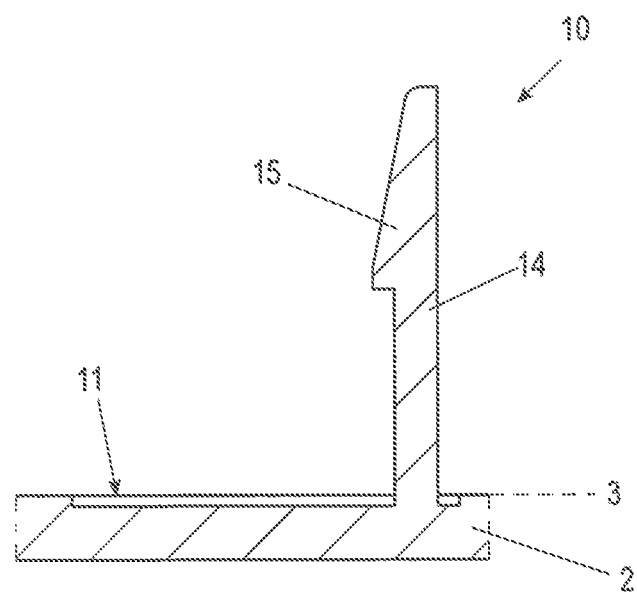
FIGS. 4a and 4b are sectional views through a third fastening element taken along line C-C of FIG. 1 before and after the fastening element has been broken off, respectively.

FIGS. 2a, 3a and 4a show the various fastening elements 10 in greater detail, each in a cross-section taken along lines A-A, B-B, and C-C, respectively, of FIG. 1. FIG. 2a shows one of the round bases 12, FIG. 3a shows one of the screw-in bosses 13 and FIG. 4a shows one of the latching tongues 14.

In the cross-sectional drawing of FIG. 4a, it is shown that the latching tongue 14 has an under-cut latching hook 15 in the upper region, with which it reaches across installed components, for example a circuit board, at its upper side.

Figure 2B:
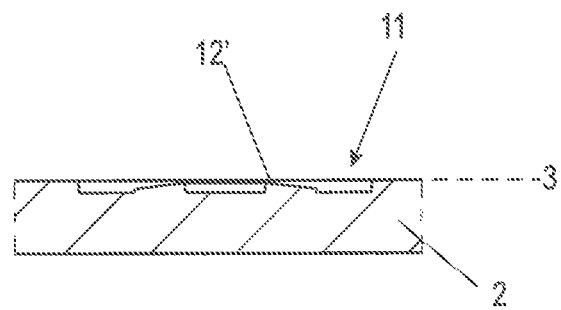
Figure 3B:
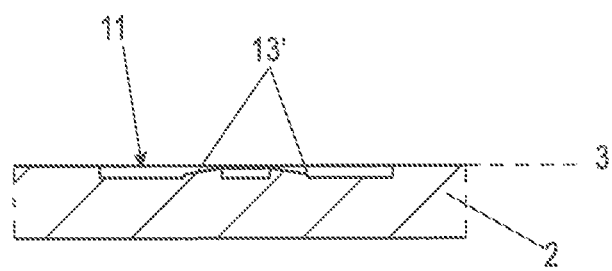
Figure 4B:
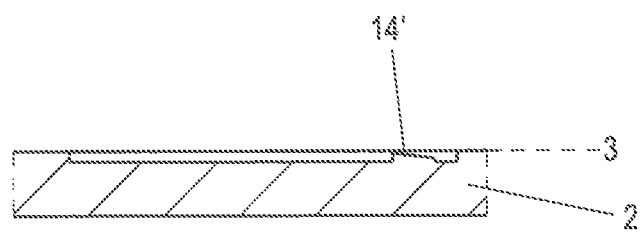

FIGS. 2b, 3b and 4b show the same cross-sectional views as in FIGS. 2a, 3a and 4a, respectively, after the corresponding fastening element 10 has been broken off. Of the respective fastening elements 10, fracture residues 12', 13', and 14' remain. As is shown by FIGS. 2b, 3b and 4b, the remaining fracture residues 12', 13', 14' are elevated above the base surface of the recess 11 associated with the respective fastening elements 10, but they do not protrude beyond the surface 3 of the housing bottom 2.

Figure 3C:
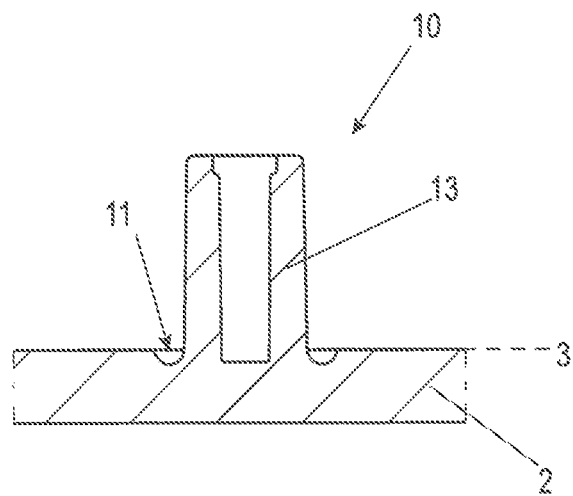

The recesses 11 adjacent to the round bases 12 and the latching tongues 14 have a rectangular configuration, preferably square, as measured and recorded around the respective fastening element 10. Such a rectangular or square form is preferred in that the jaws of a pliers can grab the associated fastening element 10 for breaking off, reaching down as far as the bottom of the recess 11. However, other geometrical configurations are possible for the recess 11. For the screw-in boss 13, a concentric and annular trenchlike recess 11 surrounding the fastening element 10 is shown as an example in FIG. 3c.

In the preferred embodiment of FIG. 1, all fastening elements 10 surrounded by a recess 11 are arranged on the bottom 2 of the housing base portion 1. Of course, fastening elements with a surrounding recess may also be provided on other housing portions or housing surfaces, for example, on the inside of the side walls 4, in a similar manner.

The invention claimed is:

1. A housing for holding at least one electromechanical, electrical and/or electronic component, comprising
    (a) a base containing at least one recess in a portion thereof; and
    (b) at least one component fastening element integrally formed with said base portion and within said at least one recess, whereby when said component fastening element is removed, a residual fracture portion thereof is retained in said recess.

2. The housing as defined in claim 1, wherein said at least one component fastening element is arranged on a bottom of said base.

3. The housing as defined in claim 1, wherein said at least one component fastening element comprises one of a base, a screw boss, or a latching tongue.

4. The housing as defined in claim 1, wherein each recess has a rectangular configuration and surrounds each component fastening element.

5. The housing as defined in claim 4, wherein each recess is configured as a trench which encircles each component fastening element.

6. The housing as defined in claim 1, wherein each recess has a depth of 0.3 to 0.8 mm with respect to a surface of said base.

* * * * *